(12) United States Patent
Hara et al.

(10) Patent No.: US 7,960,914 B2
(45) Date of Patent: Jun. 14, 2011

(54) IMAGE DISPLAY ELEMENT INCLUDING ELECTRODE TERMINAL FREE FROM CONTACT INHIBITING FACTOR

(75) Inventors: Zenichiro Hara, Tokyo (JP); Satoru Kiridoshi, Tokyo (JP); Suguru Nagae, Tokyo (JP); Takanori Okumura, Tokyo (JP); Yoshiyuki Suehiro, Tokyo (JP); Nobuo Terazaki, Tokyo (JP); Jun Sugahara, Yamagata (JP); Ryota Oki, Yamagata (JP); Takeshi Yoshida, Yamagata (JP); Yutaka Saito, Yamagata (JP); Yuji Saito, Yamagata (JP); Toshinao Yuki, Yamagata (JP); Hiroyuki Sato, Yamagata (JP); Yoshinori Fukuda, Yamagata (JP); Yosuke Sato, Yamagata (JP); Masami Kimura, Yamagata (JP)

(73) Assignees: Mitsubishi Electric Corporation, Chiyoda-Ku, Tokyo (JP); Tohoku Pioneer Corporation, Tendo-Shi, Yamagata (JP)

( * ) Notice: Subject to any disclaimer, the term of this patent is extended or adjusted under 35 U.S.C. 154(b) by 0 days.

(21) Appl. No.: 12/700,095

(22) Filed: Feb. 4, 2010

(65) Prior Publication Data
US 2010/0328921 A1 Dec. 30, 2010

(30) Foreign Application Priority Data
Jun. 26, 2009 (JP) .................... 2009-152435

(51) Int. Cl.
*H01J 63/04* (2006.01)
*H01J 17/49* (2006.01)
(52) U.S. Cl. ....................... 313/583; 313/495
(58) Field of Classification Search .......... 313/495–497, 313/582–587
See application file for complete search history.

(56) References Cited

FOREIGN PATENT DOCUMENTS
| JP | 2001-251571 A | 9/2001 |
| JP | 2005-183106 | 7/2005 |
| JP | 2008-191502 A | 8/2008 |

OTHER PUBLICATIONS

European Search Report issued in the corresponding European Application No. 10152582.2-2205 dated May 20, 2010.

*Primary Examiner* — Joseph L Williams
(74) *Attorney, Agent, or Firm* — Buchanan Ingersoll & Rooney PC

(57) ABSTRACT

An image display element includes: a front panel; a back panel opposite thereto; plural pixels arranged in a matrix between the panels; and plural electrodes for controlling the pixels. The panels are bonded with the pixels and the electrodes interposed therebetween. The electrodes are connected to a driving circuit via metal film wires. The back panel is divided so as to expose electrode terminals, and a groove part V-shaped in cross section is formed at the divided portion. The metal film wires are formed on the top surface of the back panel, and the electrode terminals and the metal film wires are connected by a conductive paste coated along the tilt surfaces forming the groove part. A contact resistance reducing means is disposed at the connection part interface between the electrode terminal and the conductive paste.

4 Claims, 11 Drawing Sheets

LOW CONNECTION RESISTANCE REGION

LOW RESISTANCE REGION

IMAGE DISPLAY ELEMENT INCLUDING ELECTRODE TERMINAL FREE FROM CONTACT INHIBITING FACTOR

BACKGROUND OF THE INVENTION

1. Field of the Invention

The present invention relates to a large size image display device including, for example, a large number of liquid crystal display (LCD) panels, plasma display panels (PDP), or electroluminescent (EL) display panels, arranged therein. More particularly, it relates to an image display element forming the device and a manufacturing method thereof.

2. Background Art

For a large size image display device (which is also referred to as a large size display), in order to implement high performances at a low cost, there has been adopted the system in which a plurality of flat panel displays (e.g., LCD panels, PDPs, or EL display panels) as image display elements (or, display units) are arranged in a matrix.

One example of a conventional image display element forming such a large size display is shown in FIGS. 11A and 11B.

FIGS. 11A and 11B are views showing a part of the array (2-sheet array) of the image display elements. FIG. 11A is a front view, and FIG. 11B is a side view.

An image display element 30 has a front panel 31 and a back panel 32 formed of glass or the like. The front panel 31 and the back panel 32 are opposed each other with a prescribed distance therebetween, between which a plurality of pixels 33, and a plurality of electrodes (not shown) for controlling them are arranged to form a light emitting layer (or a liquid crystal layer). Thus, the periphery thereof is sealed with a seal part 34 with a seal width g1.

When a lead line for applying a voltage to the electrode is led out from the periphery of the image display element 30, namely, a joint part 35 of the adjacent image display elements 30, the lead-out margin is necessary. When a spacing Ga between the pixels 33 of the adjacent image display elements 30 at the joint part 35 is larger than a spacing Gb between pixels in the same image display element, the joint part 35 becomes noticeable.

Thus, as shown in an enlarged view of FIG. 11B, the back panel 32 is divided into two parts, and a gap part 36 is provided at the central part. A terminal 37 corresponding to the electrode is included at the gap part (which is also simply referred to as a gap) 36. An electrode pin or a lead line 38 as shown is connected to the terminal 37, to be led outside the back panel (see, e.g., JP-A-2001-251571).

With the conventional image display element shown in JP-A-2001-251571, the lead line 38 of the electrode is led out from the gap part 36 formed in the back panel 32. Therefore, this configuration is effective as the structure for making the joint parts 35 of the image display elements 30 less noticeable. However, it is configured such that the lead lines 38 are connected to a large number of terminals 37 present in the narrow gap part 36, thereby to be connected to a wiring layer. For this reason, connection with the terminals 37 becomes complicated, and further, unfavorably, the lead-out method is complicated, and the workability is bad.

A conventional image display element shown in JP-A-2008-191502 is provided in order to solve such a problem.

FIG. 12 is a perspective view showing a configuration of the image display element shown in JP-A-2008-191502. FIG. 13 is an enlarged view of an essential part of FIG. 12.

Below, the conventional image display element shown in JP-A-2008-191502 will be described.

A large number of the image display elements are arranged in a matrix to form a large screen flat panel display.

Examples of the display device of the image display element include a LCD panel, a PDP, and an EL display panel. Incidentally, the figure shows the image display element as seen from the back thereof.

As shown in FIG. 12, the image display element includes a front panel 21 formed of a glass plate or the like, a back panel 22 similarly formed of a glass plate or the like, and opposed to the front panel 21, a plurality of pixels (not shown) arranged in a matrix between both the panels, and to be selected to be in a display or non-display state, and a plurality of electrodes (not shown) for controlling the pixels. Both the panels 21 and 22 are bonded with each other with the pixels and the electrodes interposed therebetween.

The back panel 22 is divided between two adjacent pixel lines, and a gap 23 is formed at the divided portion. In the figure, the gap 23 is shown on an enlarged scale for easy understanding, but an actual gap 23 is a minute gap with, for example, a width of about 0.30 mm.

Further, the pixels are arranged in a matrix. Thus, when a reference is made to "between pixels", there are "between transverse pixel rows" and "between longitudinal pixel columns". However, both inclusive are referred to as "between two adjacent pixel lines".

Incidentally, as the back panel 22, the one divided into two parts at the central part is shown. However, the number of divisions and the position for division are not limited thereto. The back panel 22 may be divided into three or more parts, and the position for division may also be another position so long as it is between adjacent pixels.

On the front panel 21 side situated at the gap 23, a plurality of electrode terminals 24 connected to the electrodes are disposed. The electrode terminals 24 are formed of, for example, the same material as that for the electrodes simultaneously, and are exposed from the gap.

On the other hand, on a back surface 22a of the back panel 22 (the back side of the opposing surface from the front panel is referred to as "back surface"), and on an end face 22b which is the end part of the gap 23, metal film wires 25 are formed. The metal film wires 25 are formed by, for example, thick film printing. To the end parts of the metal film wires 25 on the back surface 22a side, a connector 26 is connected. The metal film wires 25 are connected to an external driving circuit via the connector 26.

The details of the wiring part are shown in FIG. 13. As shown in the figure, the wiring part is formed by aligning the electrode terminals 24 and the metal film wires 25 such that the metal film wires 25 on the end part 22b of the back panel 22 are in vertical contact with the electrode terminals 24 on the front panel 21 side with the back panel 22 bonded on the front panel 21. Then, solder 27 is coated on the contact portion with the both panels 21 and 22 being bonded together. Both the panels are locally heated to melt the solder for bonding.

Whereas, FIG. 14 is a perspective view showing the electrode connection part when the electrode terminals 24 have been led out from the peripheral end part of the front panel 21.

The following configuration is shown. The back panel 22 is configured to be slightly smaller than the front panel 21. Thus, upon superposition of both the panels, a step part 21a is formed at the end part, so that the electrode terminals 24 are exposed at the step part 21a. Thus, the electrode terminals 24 and the metal film wires 25 formed at the end part 22b of the back panel 22 come in contact with each other, and are bonded by soldering.

As described up to this point, the image display element shown in JP-A-2008-191502 includes: the front panel 21; the back panel 22 opposite to the front panel 21; a plurality of pixels (not shown) arranged in a matrix between both the panels, and to be selected to be in a display or non-display state; and a plurality of electrodes for controlling the pixels, wherein both the panels are bonded together with the pixels and the electrodes interposed therebetween. In such an image display element, the metal film wires 25 are formed on the back surface and the end face (surface of the end part 22b) of the back panel 22. The electrode terminals 24 corresponding to the metal film wires 25 formed on the end face of the back panel 22, and connected to the electrodes are disposed on the front panel 21 side. Thus, the metal film wires 25 formed on the end face 22b and the electrode terminals 24 are bonded together by soldering.

Therefore, as compared with the image display element shown in JP-A-2001-251571, leading out of electrodes is possible with a simple method from a narrow space without using an electrode lead line. This cancels the expansion of the joint width between the image display elements. When the image display elements are arrayed to form a large screen, the image quality is improved by joint shrinkage. Further, leading out of electrode lines is simplified, resulting in a reduction of the cost.

With the conventional image display element shown in JP-A-2008-191502, as shown in FIG. 12, the electrode terminals 24 and the metal film wires 25 are connected by direct soldering. This enables the electrodes to be led out from the gap (gap/groove part) 23 formed in the back panel 22.

However, this configuration is effective as the structure for making the joint parts of the image display elements less noticeable, but, at the groove part (gap part) in the vicinity of the terminal part occurring according to the thickness of the back panel 22, the processing tools (tools for soldering such as heads and needles) are still less likely to reach the soldering part (i.e., the contact part between the electrode terminal 24 and the metal film wire 25) situated at the recesses of the gap (groove part/gap) 23.

Particularly, a display device decreases in pixel pitch with an increase in resolution. Thus, it is also necessary to narrow the width of the gap part for carrying out lead-out of electrodes according to the decrease in pixel pitch. Accordingly, electrode lead-out processing becomes further difficult.

Therefore, the connection reliability between the electrode terminals 24 and the metal film wires 25 by soldering becomes a problem.

Further, solder 27 for connecting the electrode terminals 24 and the metal film wires 25 is disposed with a fine interval. For this reason, migration tends to occur, which leads to a problem in the insulation property of the electrode lead-out part.

Further, with the conventional image display element shown in FIG. 14, it is possible to lead out electrodes from the peripheral end part of the panel with ease. However, a problem is encountered in the panel shape in the vicinity of the terminal part for disposing the electrode lead line thereon, so that lead-out processing of electrodes becomes difficult.

Examples of the processing method include soldering, wire bonding, and connection by a conductive paste (e.g., Ag paste) or the like. However, at the step part in the vicinity of the terminal part occurring according to the thickness of the back panel 22, processing tools (such as a head) become less likely to reach the connection part situated at the recesses of the step part.

Incidentally, when a conductive paste is used for connection between the electrode terminals 24 and the metal film wires 25, upon shrinkage of the contact area between the conductive paste and the electrode terminal 24 with an increase in resolution of the display element, the electric connection resistance increases, or the resistance value becomes unstable by changes with time.

When the surface material of the electrode terminal 24 is Al or Cr, an oxide layer is formed on the surface, so that a favorable electric connection cannot be obtained.

Some materials of the electrode terminal 24 have a high electric connection resistance with the connection material 27 (solder or wire bonding), or largely change with time in electric contact resistance.

Further, on the surface of the electric terminal 24, a film may be formed, or the surface may be contaminated during the manufacturing step or the like. Thus, in some cases, the film or the contamination layer inhibits the electric contact between the electrode terminals 24 and the connection material 27, so that stable electric connection or a sufficiently low resistance electric connection cannot be obtained.

SUMMARY OF THE INVENTION

This invention has been made in order to solve the foregoing problem. It is an object of the present invention to provide an image display element capable of readily undergoing electrode lead-out processing by configuring the panel shape in the vicinity of the terminal part of the image display element in a structure suitable for use of processing tools (i.e., a head of a soldering iron, a needle for conductive paste injection, and the like) necessary for electrode lead-out processing, and further capable of reducing the contact resistance of the connection part between the conductive paste and the electrode terminal (which is also hereinafter simply referred to as a connection part) even when the conductive paste is used for connection between the electrode terminals and the metal film wires, and having a stable connection performance even when a large current is flowed through the connection part, and a manufacturing method of the image display element.

In accordance with an aspect of this invention, an image display element includes: a front panel; a back panel opposite to the front panel; a plurality of pixels arranged in a matrix between the front panel and the back panel, and to be selected to be in a display or non-display state; and a plurality of electrodes for controlling the pixels, the front panel and the back panel being bonded together with the pixels and the electrodes interposed therebetween, and the electrodes being connected to a driving circuit via metal film wires. In such an image display element, the back panel is divided such that electrode terminals connected to the electrodes are exposed between adjacent plural pixel lines, and a groove part having a shape wider at the top on the back side of the opposing surface from the front panel than at the bottom is formed at the divided portion, and the metal film wires are formed on the back side surface of the surface of the back panel opposite to the front panel, the electrode terminals and the metal film wires are connected by a conductive paste coated along a tilt surface forming the groove part, and a contact resistance reducing means is disposed at the interface of the connection part between the electrode terminal and the conductive paste.

Further, another aspect of the invention provides a method for manufacturing an image display element including: a front panel; a back panel opposite to the front panel; a plurality of pixels arranged in a matrix between the front panel and the back panel, and to be selected to be in a display or non-display state; and a plurality of electrodes for controlling the pixels, the front panel and the back panel being bonded together with the pixels and the electrodes interposed therebetween, and the electrodes being connected to a driving circuit via metal film wires.

The method, includes: a first step of dividing the back panel such that electrode terminals connected to the electrodes are exposed between adjacent plural pixel lines, and forming a groove part having a shape wider at the top on the back side of the opposing surface from the front panel than at the bottom at the divided portion; a second step of forming the metal film wires on the back side surface of the surface of the back panel opposite to the front panel, a third step of connecting the electrode terminals and the metal film wires by a conductive paste coated along a tilt surface forming the groove part, and a fourth step of disposing a contact resistance reducing means at the interface of the connection part between the electrode terminal and the conductive paste.

In accordance with the invention, it is possible to provide an image display element capable of readily undergoing electrode lead-out processing, and capable of reducing the contact resistance of the connection part between the conductive paste and the electrode terminal even when the conductive paste is used for connection between the electrode terminal and the metal film wire, and having a stable connection performance even when a large current is flowed through the connection part, and a manufacturing method thereof.

The foregoing and other object, features, aspects, and advantages of the present invention will become more apparent from the following detailed description of the present invention when taken in conjunction with the accompanying drawings.

DESCRIPTION OF THE PREFERRED EMBODIMENTS

Below, embodiments of the present invention will be described by reference to the accompanying drawings.

Embodiment 1

Figure 1:
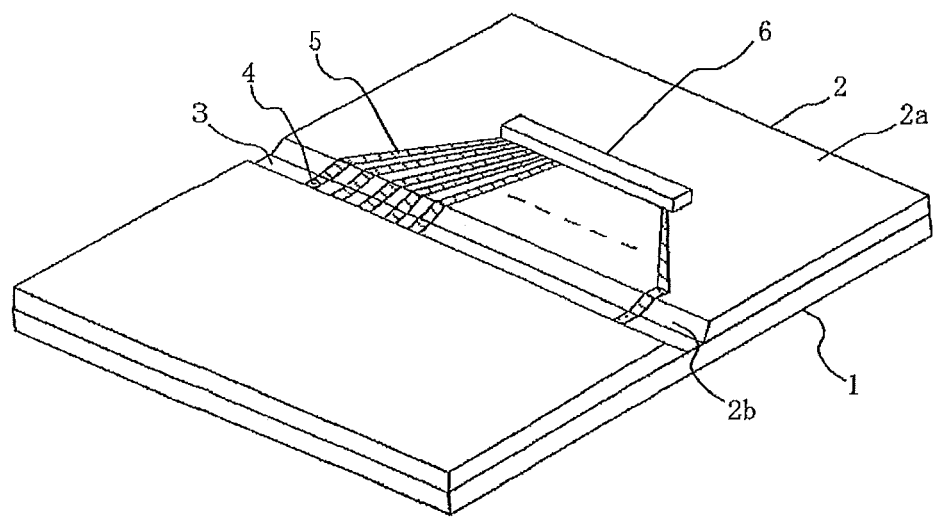
FIG. 1 is a perspective view for illustrating the basic configuration of an image display element in accordance with Embodiment 1 of the present invention.
Figure 2:
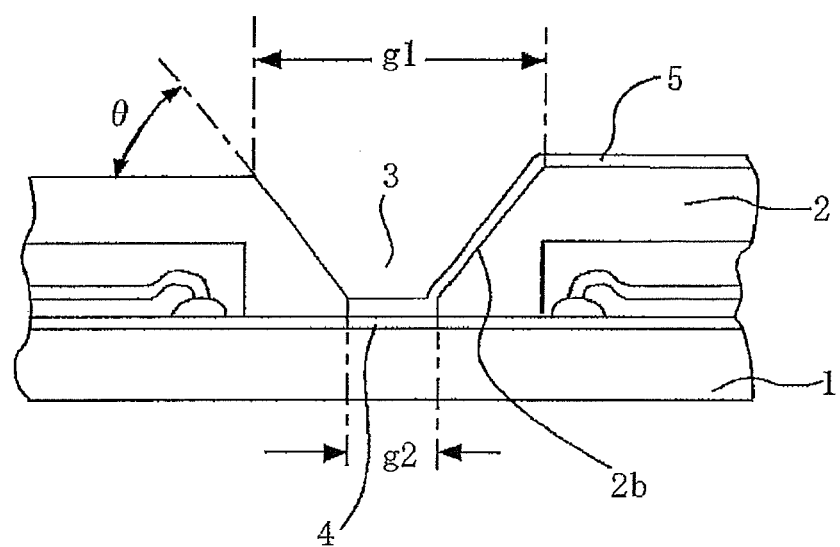
FIG. 2 is an enlarged cross-sectional view of an essential part of FIG. 1.

FIG. 1 is a perspective view for illustrating the basic configuration of an image display element in accordance with Embodiment 1 of this invention, and FIG. 2 is an enlarged cross-sectional view of an essential part of FIG. 1.

A large number of the image display elements are arranged in a matrix, thereby to form a large-size flat-panel display.

As the display devices of the image display elements, for example, LCD panels, PDPs, and EL display panels are used.

As shown in FIG. 1, the image display element includes a front panel 1 formed of a glass plate or the like, a back panel 2 similarly formed of a glass plate or the like, and opposed to the front panel 1, a plurality of pixels (not shown) arranged in a matrix between the front panel 1 and the back panel 2, and to be selected to be in a display or non-display state, and a plurality of electrodes (not shown) for controlling the pixels. The front panel 1 and the back panel 2 are bonded with each other with the pixels and the electrodes interposed therebetween. The back panel 2 is divided in such a manner as to form a groove part 3 having a V shape by cutting using a dicing blade (dicing), or the like between the adjacent plural pixel lines.

Incidentally, in the figure, the groove part 3 is shown on an enlarged scale for easy understanding, but in actuality, the groove part 3 is a minute gap.

Further, the pixels are arranged in a matrix. Thus, when a reference is made to "between pixels", there are "between transverse pixel rows" and "between longitudinal pixel columns". However, both inclusive are referred to as "between two adjacent pixel lines".

Then, on the front panel 1 side situated at the groove part 3, a plurality of electrode terminals 4 connected to the electrodes are arranged. The electrode terminals 4 are formed of, for example, the same material as that for the electrodes simultaneously, and are exposed at the groove part 3.

On the other hand, a back surface 2a of the back panel 2 (the back side of the opposing surface from the front panel) is referred to as "back surface". (the same applies hereinafter)

On an end face (tilt surface) 2b of the end part of the back panel 2 forming the groove part 3, metal (e.g., Ag) film wires 5 are formed. To the end parts of the metal film wires 5 on the back surface 2a side, a connector 6 is connected.

The metal film wires 5 are connected to an external driving circuit via the connector 6.

Incidentally, the materials for the metal film wires 5 are not limited to Ag, and common wiring materials may be used. Whereas, the wiring method of the metal film wires 5 also has no particular restriction, and, other wiring structures such as FPC may be included between the metal film wires 5 and the connector 6.

The details of the wiring part are shown in FIG. 2. As shown in the figure, the wiring part is formed by aligning the electrode terminals 4 and the metal film wires 5 such that the metal film wires 5 on the tilt surface 2b on the end part of the back panel 2 are in contact with the electrode terminals 4 on the front panel 1 side with the back panel 2 bonded on the front panel 1.

Incidentally, the portion of each electrode terminal 4 exposed at the groove part 3 is covered with each metal film wire 5. As a result, the electrode terminal 4 is in contact with the metal film wire 5 with reliability.

For the electrode terminals 4, there can be used a metal material such as Au, Ag, Cu, Al, Cr, Mo, or Ti, a conductive oxide such as ITO or ZnO, or a conductive polymer such as PEDOT:PSS, or a composite material thereof. The materials are not limited thereto, and can be appropriately changed according to the image display element.

Further, also in FIG. 1, the portion of each electrode terminal 4 exposed at the groove part 3 is entirely covered with each metal film wire 5.

In FIG. 1, in order to show that the portion of each electrode terminal 4 exposed at the groove part 3 is covered with each metal film wire 5, the metal film wire 5 is shown in a partially cut away view.

The back panel 2 is generally formed of glass. For this reason, the metal film wires 5 are formed by coating with thick film printing or the like, using, for example, a silver (Ag) paste, followed by sintering.

In this case, the processing tools such as needles and heads necessary for performing thick film printing or the like are required to be moved in proximity to the end face 2b of the back panel 2.

Figure 3:
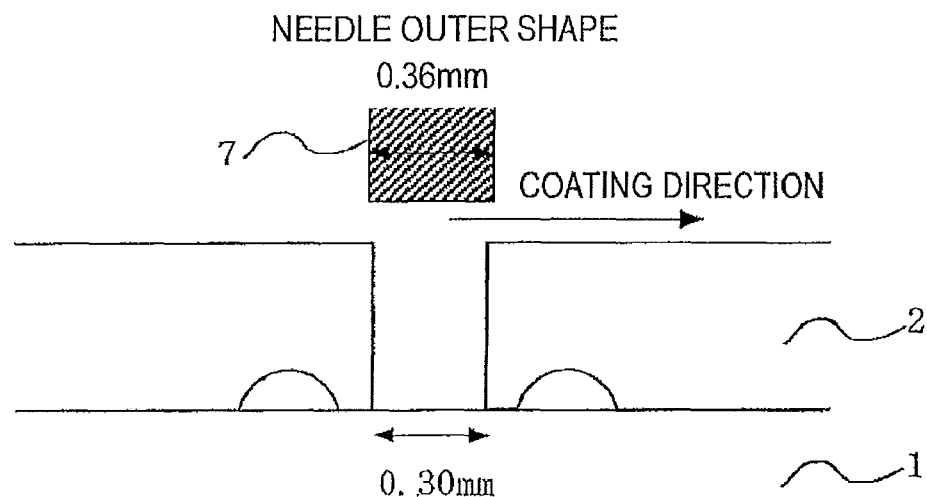
FIG. 3 is a view showing a state in which the width of a groove part is smaller than the width dimension of a tool.

Herein, as shown in FIG. 3, when the end face 2b of the back panel 2 is vertical to the panel surface, and the width of the groove part 3 is smaller than the width dimension of a tool 7, such as a width of the groove part 3 of 0.30 mm, and a width dimension of the tool 7 of 0.36 mm, thick film printing is difficult to properly perform.

Figure 4:
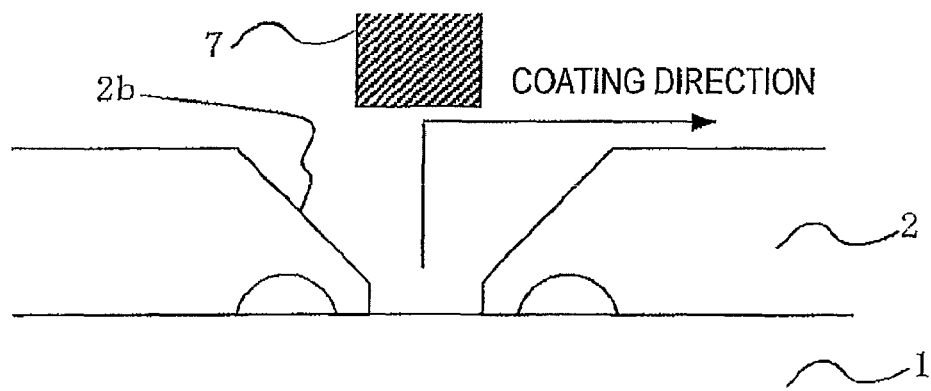
FIG. 4 is a view showing a state in which the groove part is in a V shape.

In contrast, in Embodiment 1, in the divided portion of the back panel 2, the groove part 3 having a V shape wider at the top on the opposite side of the front panel 1 than at the bottom is formed. Therefore, as shown in FIG. 4, the tool 7 necessary for thick film printing or the like can be moved in proximity to the end face 2b of the back panel 2. This enables the metal film wires 5 to be formed with ease and precision.

Incidentally, in FIG. 2, "g1" denotes the width of the top of the groove part 3; "g2", the width of the bottom; and "θ", the tilt angle of the end part (end face) 2b of the back panel 2.

In accordance with this invention, as shown in FIGS. 1, 2, and 4, an image display element includes: the front panel 1; the back panel 2 opposite to the front panel 1; a plurality of pixels arranged in a matrix between both the panels (i.e., the front panel 1 and the back panel 2), and to be selected to be in a display or non-display state; and a plurality of electrodes for controlling the pixels. Both the panels are bonded together with the pixels and the electrodes interposed therebetween. In such an image display element, the back panel 2 is divided in such a manner as to form a groove part having a shape wider at the top on the opposite side of the front panel 1 than at the bottom between adjacent plural pixel lines. Thus, the metal film wires 5 for connecting the electrodes to a driving circuit are formed along the end face (tilt surface 2b) situated at the groove part 3. This enables the electrodes to be led out from the narrow region of the panel. When a plurality of the image display elements are displayed in a matrix, the width of the joint part can be narrowed. As a result, it is possible to implement a high-resolution image display device with unnoticeable joint parts. In addition, further, it is possible to implement a high-reliability image display device capable of improving the reliability of the metal film wires themselves, and inhibiting the occurrence of migration between the adjacent metal film wires or between electrode terminals, and the like.

Up to this point, the basic configuration and the effects of the image display element in accordance with the invention were described. However, below, a description will be given to a characteristic specific example of the image display element in accordance with Embodiment 1.

Figure 5:
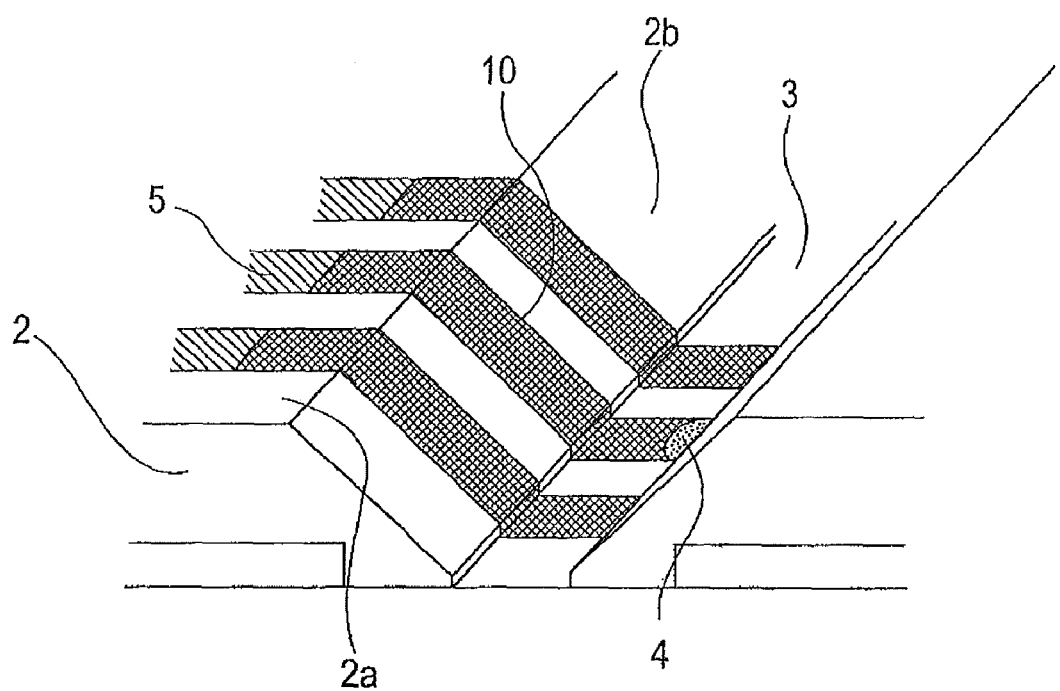
FIG. 5 is a conceptual view for illustrating a characteristic structure of the image display element in accordance with Embodiment 1.

FIG. 5 is a conceptual view for illustrating the characteristic structure of the image display element in accordance with Embodiment 1.

As shown in FIG. 5, when an easily oxidizable metal such as aluminum is formed on the surface of the electrode terminal 4 exposed at the groove part 3, there is a contact inhibiting factor which increases the contact resistance (for aluminum, it is an oxide film formed on the surface of the electrode terminal 4).

It is necessary to remove a part of the contact inhibiting factor formed on the surface of the electrode terminal 4.

This embodiment is characterized in that a contact resistance reducing means is provided at the interface of the connection part between the electrode terminal 4 and the conductive paste (e.g., Ag paste) 10. This is the description of an example in which a part of the contact inhibiting factor is removed as one example of the contact resistance reducing means.

In the example shown in FIG. 1, the metal film wires 5 for connecting the electrode terminals 4 to an external driving circuit via the connector 6 are formed to also cover the region of "the end part 2b of the back panel 2" which is the tilt surface forming the V-shaped groove part (i.e., the groove part having a shape wider at the top on the opposite side of the front panel 1 than at the bottom) 3 so as to be in direct contact with the end parts of the electrode terminals 4.

Incidentally, the metal film wires 5 are, as described above, formed by coating, for example, a Ag paste in a thick film, followed by sintering, and are arranged in correspondence with respective electrodes.

In contrast, in FIG. 5, connection between the electrode terminals 4 situated at the bottom of the V-shaped groove part 3 and the metal film wires 5 formed on the back surface 2a of the back panel 2 is established by coating of a conductive paste (e.g., Ag paste) 10 therebetween.

Incidentally, the conductive paste 10 is coated on the top of each electrode terminal 4. However, in order to show this state, in FIG. 5, the conductive paste 10 is shown in a partially cutaway view.

Further, FIG. 5 is drawn as if the end part of each metal film wire 5 was in contact with the end part of each conductive paste 10 to establish connection therebetween. However, in actuality, the conductive paste 10 is coated even to the top of the end part of each metal film wire 5.

Wiring by the conductive paste 10 facilitates processing, and control of the thickness of the conductive paste 10 is also easy.

This improves the performances (e.g., uniformity of the contact resistance) of the connection part between the electrode terminal 4 and the metal film wire 5, and the reliability of connection.

However, at the connection part between the electrode terminal 4 and the conductive paste 10, a contact inhibiting factor which increases the contact resistance occurs at the interface between the electrode terminal 4 and the conductive paste 10. The contact inhibiting factor reduces the reliability when a large current is flowed.

Figure 6A:
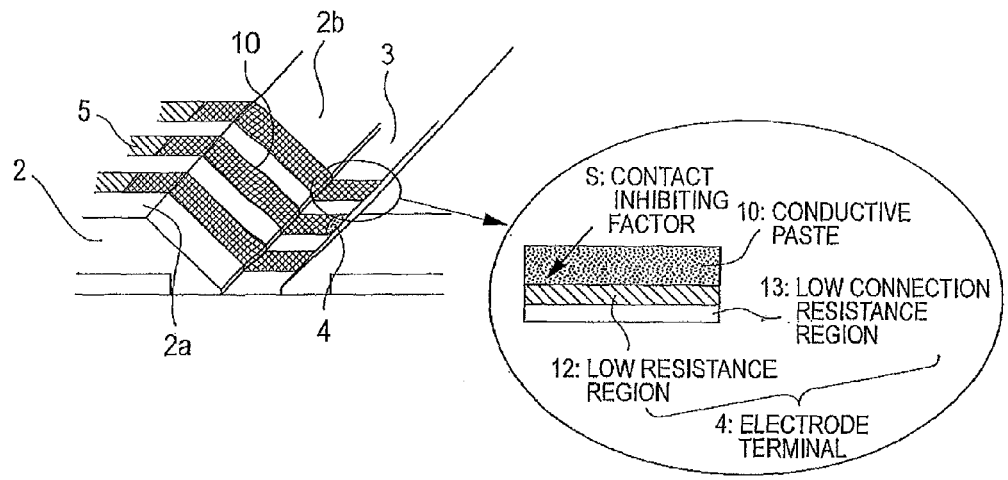
FIGS. 6A to 6C are views each for illustrating a manufacturing step for preventing the occurrence of a contact inhibiting factor.
Figure 6B:
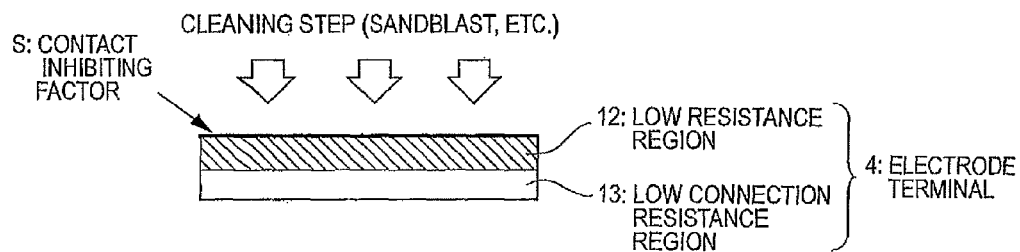
Figure 6C:
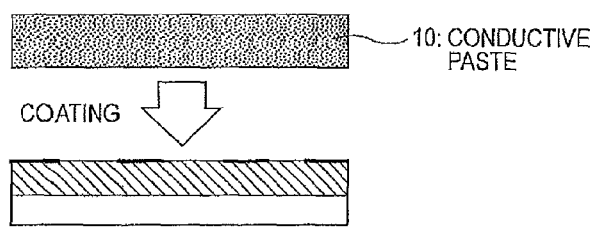

FIGS. 6A to 6C are views each for illustrating an example of a manufacturing step for preventing the occurrence of such a contact inhibiting factor.

FIG. 6A is an enlarged cross-sectional view of the connection part between the electrode terminal 4 and the conductive paste 10 shown in FIG. 5. The electrode terminal 4 is formed of a lamination of a low-resistance metal material such as aluminum, and a low connection resistance material with a low connection resistance with a conductive paste such as ITO.

At the connection interface between the electrode terminal 4 and the conductive paste 10, a contact inhibiting factor S such as aluminum oxide is formed.

The contact inhibiting factor S inhibits the electric contact between the electric terminal 4 and the conductive paste 10. Thus, when a large current is flowed through the connection part, unfavorably, the stable connection performance is damaged.

Embodiment 1 is characterized by removing the contact inhibiting factor S before the step of stacking the electrode terminal 4 and the conductive paste 10 in regard to the fourth step.

FIGS. 6B and 6C each show a detailed description of the removing step (fourth step).

FIG. 6B is an explanatory view of a step of cleaning the contact inhibiting factor S formed on the surface of the electrode terminal 4. Examples of the cleaning step include laser light irradiation, contaminant removal (such as cleaning, polishing, or etching), a simple blast treatment, a heat treatment, and an aging treatment.

FIG. 6C illustrates the step of stacking the conductive paste 10 on the electrode terminal 4 after the cleaning step. The conductive paste 10 is patterned by coating, printing, or the like. As a result, the connection part is formed.

As described above, the image display element according to this embodiment includes: the front panel 1; the back panel 2 opposite to the front panel 1; a plurality of pixels arranged in a matrix between the front panel 1 and the back panel 2, and to be selected to be in a display or non-display state; and a plurality of electrodes for controlling the pixels. The front panel 1 and the back panel 2 are bonded together with the pixels and the electrodes interposed therebetween, and the electrodes are connected to a driving circuit via the metal film wires 5. In such an image display element, the back panel 2 is divided such that electrode terminals 4 connected to the electrodes are exposed between adjacent plural pixel lines, and the groove part 3 having a shape wider at the top on the back side of the opposing surface from the front panel 1 than at the bottom is formed at the divided portion. The metal film wires 5 are formed on the back side surface 2a of the surface of the back panel 2 opposite to the front panel 1. The electrode terminals 4 and the metal film wires 5 are connected by the conductive paste 10 coated along the tilt surface forming the groove part 3. A contact resistance reducing means is disposed at the interface of the connection part between the electrode terminal 4 and the conductive paste 10.

This enables the electrodes to be led out from the narrow region of the panel. As a result, a high-resolution image display device with unnoticeable joint parts of the panel can be implemented with ease. In addition, the contact resistance of the connection part between the electrode terminal 4 and the conductive paste 10 can be reduced. it is possible to provide an image display element capable of having a stable connection performance even when a large current is flowed through the connection part, and a manufacturing method thereof.

As described in Embodiment 1, the contact resistance reducing means is a connection part from which a part of the contact inhibiting factor has been removed by a cleaning step, and at which the electrode terminal 4 and the conductive paste 10 are electrically connected.

Further, the fourth step of disposing the contact resistance reducing means at the interface of the connection part is a removal step of removing a part of the contact inhibiting factor inhibiting the electric contact of the connection part.

Embodiment 2

In Embodiment 1 described above, the step of removing the contact inhibiting factor of the connection part is characterized by removing the contact inhibiting factor S before stacking of the electrode terminal 4 and the conductive paste 10.

In contrast, an image display element according to this embodiment is characterized by irradiating the contact inhibiting factor S with a laser light after stacking of the electrode terminal 4 and the conductive paste 10.

Figure 7A:
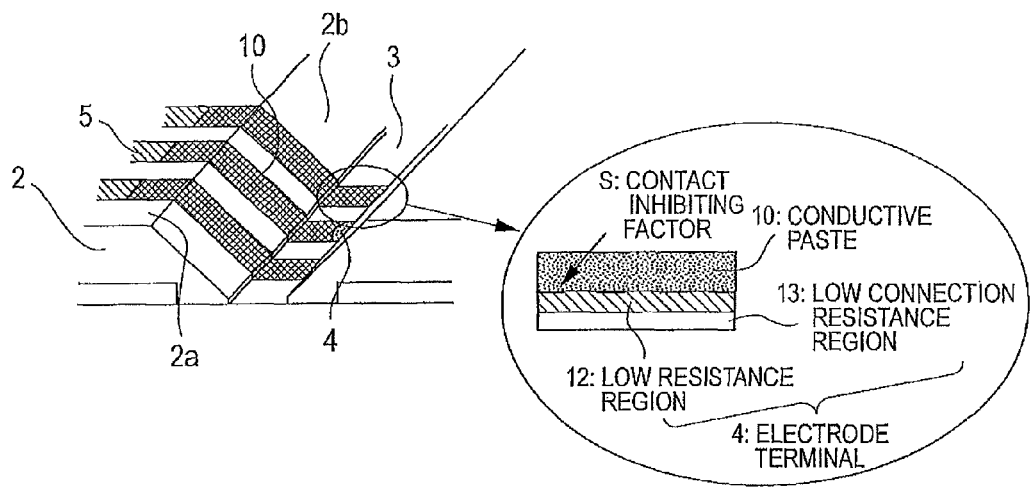
FIGS. 7A to 7C are each a conceptual view for illustrating a characteristic structure of an image display element in accordance with Embodiment 2.
Figure 7B:
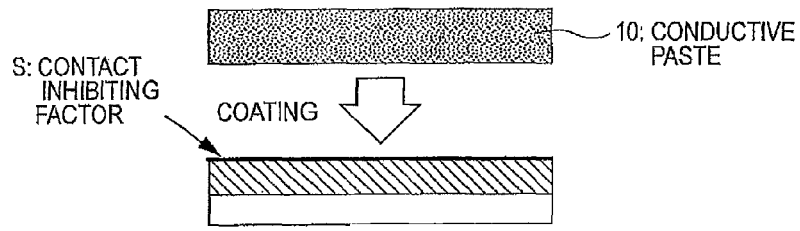
Figure 7C:
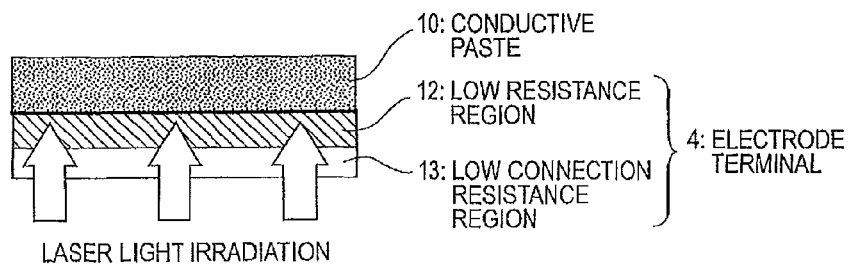

FIGS. 7A to 7C are views each for illustrating a characteristic structure of the image display element according to Embodiment 2, and a manufacturing step for preventing the occurrence of the contact inhibiting factor.

FIG. 7A is an enlarged cross-sectional view of the connection part between the electrode terminal 4 and the conductive paste 10 shown in FIG. 5. In regard to the removal step of removing at least a part of the contact inhibiting factor S which is the feature of the present application, Embodiment 2 is characterized in that the contact inhibiting factor S is removed after stacking of the electrode terminal 4 and the conductive paste 10.

FIGS. 7B and 7C are each a detailed description of the removal step of the contact inhibiting factor (fourth step).

FIG. 7B is an explanatory view of a connection part formation step of coating the conductive paste 10 on the electrode terminal 4, and forming the connection part. FIG. 7C shows a step of irradiating the contact inhibiting factor S which is the connection interface between the electrode terminal 4 and the conductive paste 10 with a laser light after the connection part formation step. The used light source in laser light irradiation is a laser capable of providing a desirable output such as a YAG laser. By means of an optical system, output lights therefrom are converged in a spot to be applied to the contact inhibiting factor S.

Also with this method, it is possible to reduce the electric resistance at the connection part between the electrode terminal 4 and the conductive paste 10. As a result, the performance and reliability of connection can be improved.

As described in Embodiment 2, the contact resistance reducing means is a connection part from which a part of the contact inhibiting factor has been removed by irradiation with a laser light, and at which the electrode terminal 4 and the conductive paste 10 are electrically connected.

Embodiment 3

In Embodiment 1 described above, the step of removing the contact inhibiting factor of the connection part is characterized by removing the contact inhibiting factor S before stacking of the electrode terminal 4 and the conductive paste 10.

In contrast, an image display element according to Embodiment 3 is characterized in that a part of the contact inhibiting factor S has been removed at time of formation of the electrode terminals 4.

Figure 8A:
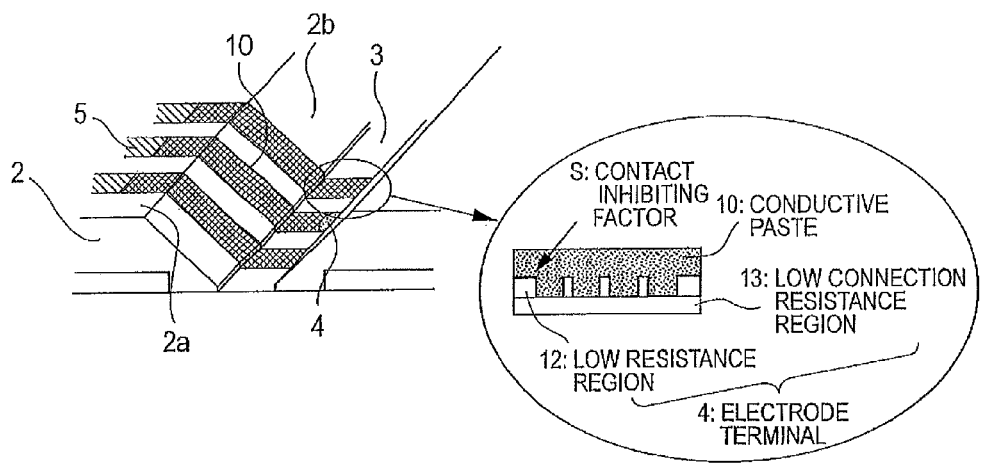
FIGS. 8A to 8C are each a conceptual view for illustrating a characteristic structure of an image display element in accordance with Embodiment 3.
Figure 8B:
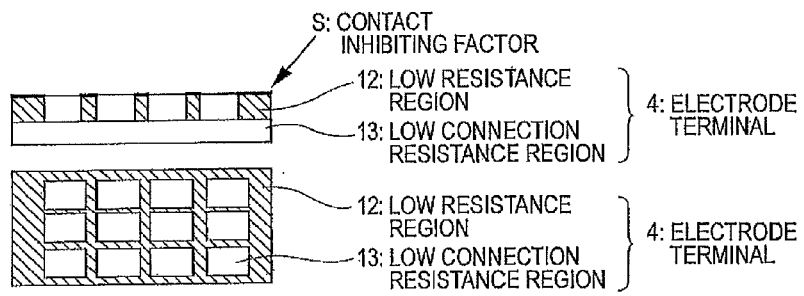
Figure 8C:
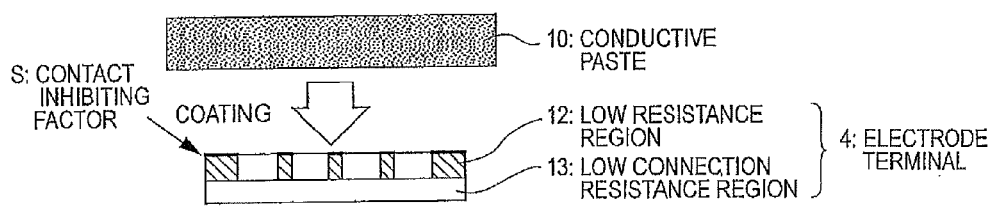

FIGS. 8A to 8C are views each for illustrating a characteristic structure of the image display element according to Embodiment 3, and a manufacturing step for preventing the occurrence of the contact inhibiting factor.

FIG. 8A is an enlarged cross-sectional view of the connection part between the electrode terminal 4 and the conductive paste 10 shown in FIG. 5.

In regard to the removal step of removing at least a part of the contact inhibiting factor S which is the feature of the present application, Embodiment 3 is characterized in that the contact inhibiting factor S is removed in the step of forming the electrode terminals 4 before stacking the electrode terminals 4 and the conductive pastes 10.

FIGS. 8B and 8C are each a detailed description of the removal step (fourth step).

The electrode terminal 4 at the connection part includes a low resistance region 12 as the upper layer, and a low connection resistance region 13 as the lower layer, stacked therein.

FIG. 8B is an explanatory view of an electrode terminal formation step of removing a portion of the low resistance region 12 at the connection part, and exposing a portion of the low connection resistance region 13.

The low resistance region 12 is formed of a low resistance metal material such as aluminum. The low connection resistance region 13 is formed of a low connection resistance material with a low connection resistance with the conductive paste such as ITO.

After stacking of the low resistance region 12 and the low connection resistance region 13, the low resistance region 12 may be patterned by etching or the like. Alternatively, after deposition of the low resistance connection region 13, the low resistance region 12 may be patterned after formation of a resist or the like.

FIG. 8C shows a step of coating the conductive paste 10 on the electrode terminal 4 after the electrode terminal formation step. The connection part of the electrode terminal 4 to be connected to the conductive paste 10 includes two kinds of regions of the low resistance region 12 and the low connection resistance region (i.e., a region with a low connection resistance with the conductive paste) 13.

Figure 9:
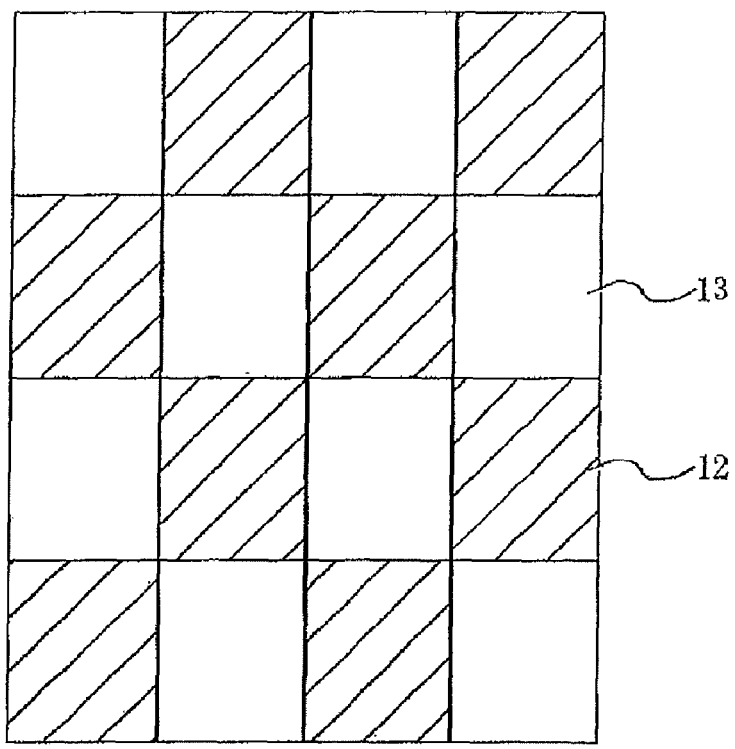
FIG. 9 is another modified example for showing a characteristic structure of the image display element in accordance with Embodiment 3.
Figure 9:
Figure 9:

As shown in FIG. 8B, the connection part may be in a shape such that there are openings at the low connection resistance region 13 in a lattice. However, it is also acceptable that the low resistance region 12 and the low connection resistance region 13 may be arranged in a checker flag form as shown in FIG. 9.

Alternatively, the configuration is not limited thereto so long as the same effects as those in Embodiment 3 can be obtained. The shape including openings may be appropriately changed into a circular shape, an ellipsoidal shape, a honeycomb shape, a star shape, or the like according to the design of the image display device.

It is essential only that the conductive paste 10 has a site to be connected to both of the low resistance region 12 and the low connection resistance region 13.

With the image display device according to this embodiment, by thus forming the connection part of the electrode terminal 4 to be connected to the conductive paste 10, it is possible to flow a large current through the connection part. In addition, it is possible to obtain a stable connection between the conductive paste 10 and the electrode terminals 4. This results in a reduction of the electric resistance at the connection part between the electrode terminal 4 and the conductive paste 10, which can improve the performances and reliability of the connection.

The contact resistance reducing means referred to in Embodiment 3 denotes the connection part having a portion at which the low resistance connection region 13 of the electrode terminal 4 is electrically connected to the conductive paste 10 and a portion at which the low resistance region 12 of the electrode terminal 4 is electrically connected to the conductive paste 10.

Incidentally, as examples of the contact resistance reducing means of the image display element according to the invention, Embodiments 1 to 3 in which a part of the contact inhibiting factor is removed were described. However, the means is not limited thereto, the setting thereof may be appropriately changed according to the use of the image display element so long as the effect of reducing the contact resistance of the connection part is produced.

Further, needless to say, even when some of, or all of Embodiments 1 to 3 described above are combined, the electric resistance at the connection part between the electrode terminal 4 and the conductive paste 10 can be reduced. Further, the performances and reliability of the connection can be improved.

Embodiment 4

In order to illustrate the relationship between the electrode terminals 4 and the pixels of the image display element 1 of a large size display in the invention, a description will be given to a case using an EL display panel as one example of the image display element as below.

This case is an example in which the image display element of FIG. 1 is formed of an EL display panel.

Incidentally, the image display element of the invention is not limited thereto, and is also applicable to a liquid crystal panel, a PDP, and the like.

Figure 10:
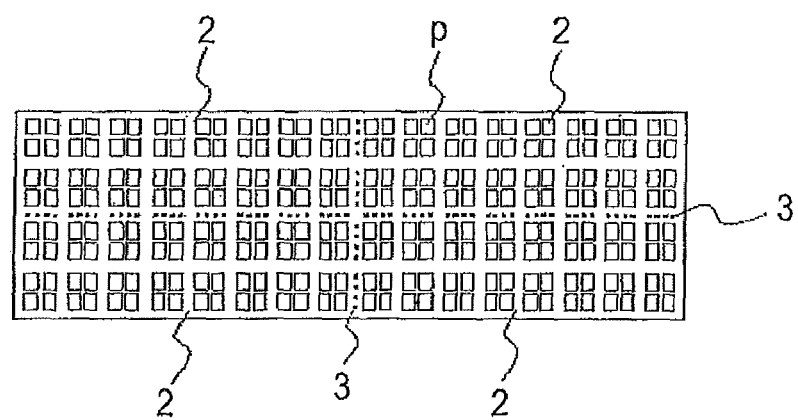
FIG. 10 is a view for illustrating a structure of an image display element in accordance with Embodiment 4.
Figure 11A:
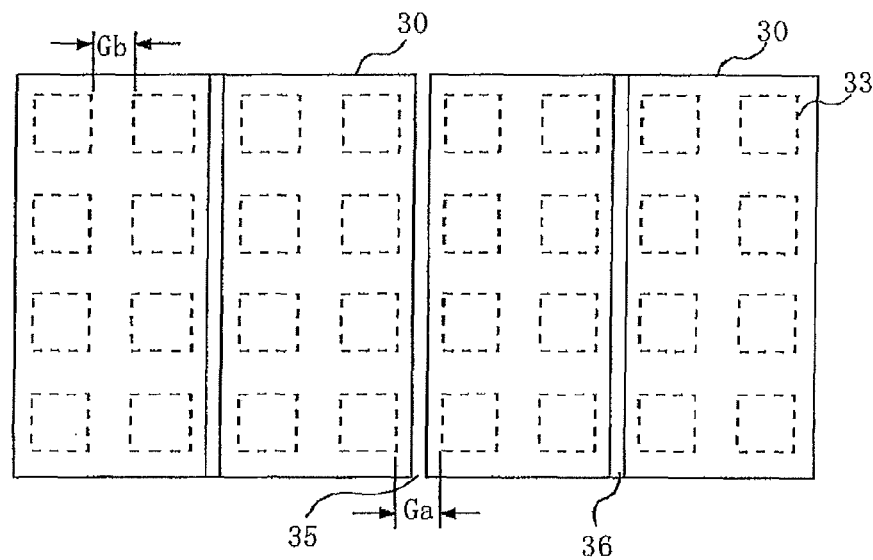
FIGS. 11A and 11B are each a view for showing a structure of a conventional image display element shown in JP-A-2001-251571.
Figure 11B:
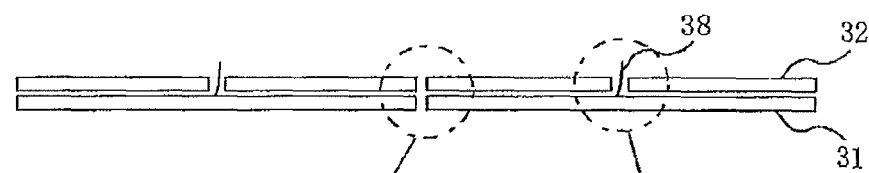
Figure 11B:
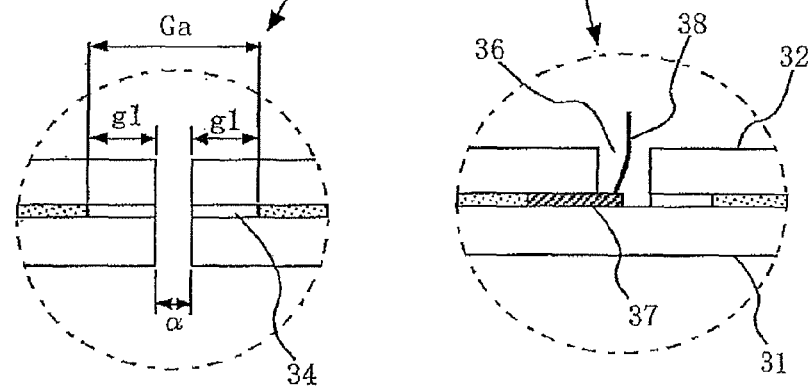
Figure 12:
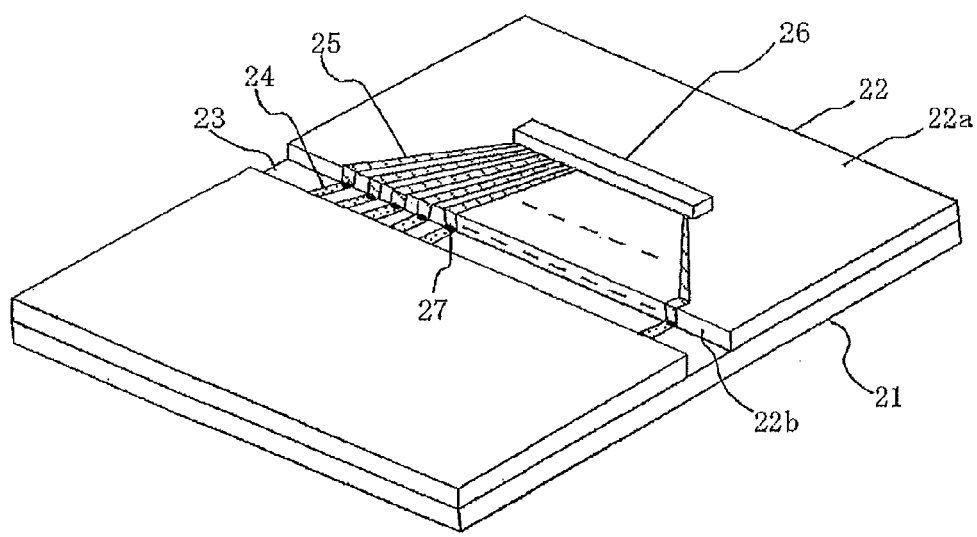
FIG. 12 is a perspective view showing a structure of a conventional image display element shown in JP-A-2008-191502.
Figure 13:
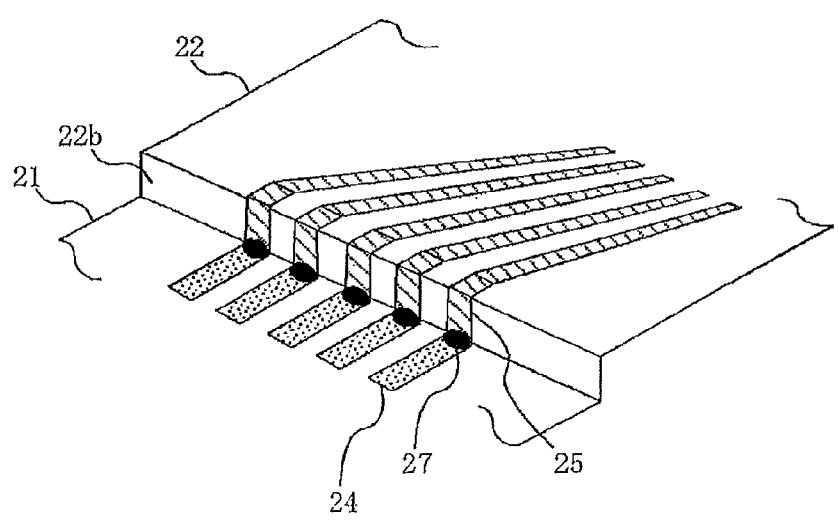
FIG. 13 is an enlarged view of an essential part of FIG. 12.
Figure 14:
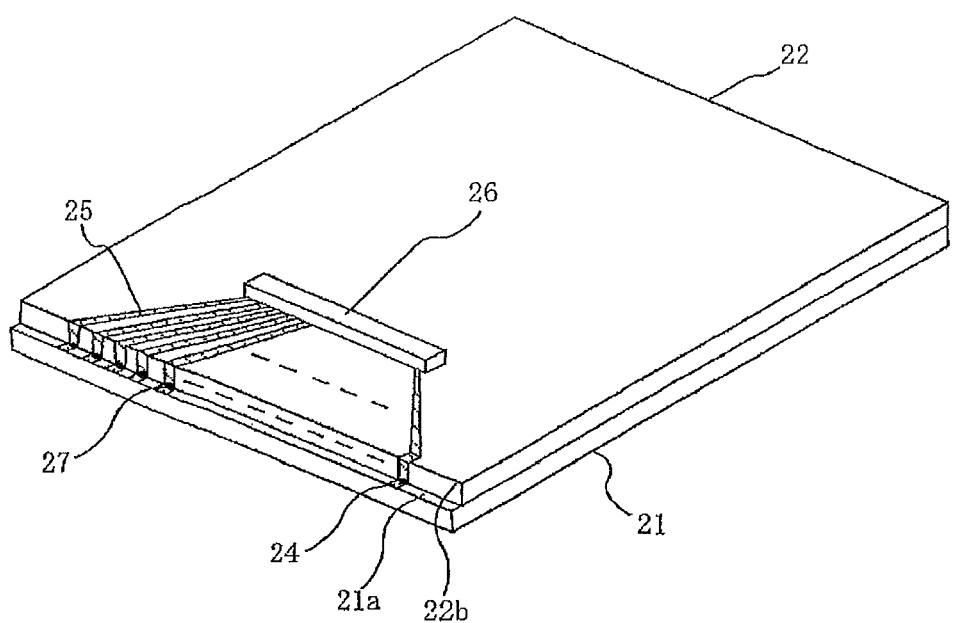
FIG. 14 is a perspective view showing an electrode connection part when an electrode terminal has been led out from the peripheral end part of a front panel in the image display element shown in JP-A-2008-191502.

FIG. 10 shows a structure of a center lead-out system in which the back panel 2 is divided into four parts by the cross-shaped groove part 3 to lead out electrodes crosswise from the center of the image display element 1.

On the front panel 1, a plurality of organic EL elements which are pixels p are arranged to control light emission/non-light emission of the pixels.

A general organic EL element includes a transparent electrode such as ITO, an organic layer including a hole transport material layer, a light emission layer, an electron transport layer, and the like, and a reflection electrode (e.g., Al), successively formed therein. Thus, light transmits through the transparent electrode from the light emission layer, and is emitted from the front panel 1 side.

The electrode terminal 4 and the transparent electrode and the reflection electrode are electrically connected, and the electrode terminal 4 is led out to the groove part 3.

Via the metal film wire 5, (the transparent electrode and the reflection electrode) are electrically connected with the connector 6. Thus, a control signal indicative of light emission/non-light emission of the organic EL element is sent from an external driving control circuit.

The electrode terminal may be formed of the same ITO as that of the transparent electrode. In order to reduce the resistance, the electrode terminal may be formed of a low resistance metal such as Al, Cr, or Ag. Alternatively, it may be formed of a lamination thereof.

The back panel 2 may be formed of glass as with the front panel 1. In the side of the back panel 2 opposite to the organic EL elements, a concave part is formed with etching, sand blast, or the like.

The panels 1 and 2 are bonded together so that the concave part-formed side of the back panel 2 and the organic EL elements-formed side of the front panel 1 oppose each other. Both the substrates are sealed and joined by an UV-curable adhesive or the like. In the sealed space by the concave part, a desiccating agent is set for protection from the deteriorating factors of the organic EL elements such as moisture.

The present invention is useful for implementing an image display element capable of undergoing electrode lead-out processing with ease, and capable of having a stable connection performance even when a large current is flowed therethrough.

Various modifications and alterations of this invention will be apparent to those skilled in the art without departing from the scope and spirit of this invention, and it should be understood that this is not limited to the illustrative embodiments set forth herein.

What is claimed is:

1. An image display element, comprising:
   a front panel;
   a back panel opposite to the front panel;
   a plurality of pixels arranged in a matrix between the front panel and the back panel, and to be selected to be in a display or non-display state; and
   a plurality of electrodes for controlling the pixels, the front panel and the back panel being bonded together with the pixels and the electrodes interposed therebetween, and the electrodes being connected to a driving circuit via metal film wires, wherein
   the back panel is divided such that electrode terminals connected to the electrodes are exposed between adjacent plural pixel lines, and a groove part having a shape wider at the top on the back side of the opposing surface from the front panel than at the bottom is formed at the divided portion, and
   the metal film wires are formed on the back side surface of the surface of the back panel opposite to the front panel,
   the electrode terminals and the metal film wires are connected by a conductive paste coated along a tilt surface forming the groove part, and
   a portion free from a contact inhibiting factor which increases a contact resistance disposed at the interface of the connection part between the electrode terminal and the conductive paste.

2. The image display element according to claim 1, wherein the portion free from a contact inhibiting factor disposed at a connection between the electrode terminal and the conductive paste is formed by a cleaning step.

3. The image display element according to claim 1, wherein the portion free from a contact inhibiting factor disposed at a connection between the electrode terminal and the conductive paste is formed by laser light irradiation.

4. The image display element according to claim 1, wherein the electrode terminal of the connection part includes a low resistance region and a low connection resistance region, and the portion free from a contact inhibiting factor is disposed at a connection of the conductive paste with both of the low resistance region and the low connection resistance region.

* * * * *